United States Patent
Cruise et al.

(10) Patent No.: US 11,303,067 B2
(45) Date of Patent: Apr. 12, 2022

(54) BATTERY PACK FOR CORDLESS DEVICES

(71) Applicant: BLACK & DECKER INC., New Britain, CT (US)

(72) Inventors: Nathan J. Cruise, Phoenix, MD (US); Daniel J. White, Baltimore, MD (US); Robert J. Marcinkowski, Cockeysville, MD (US); Geoffrey S. Howard, Columbia, MD (US); Alexis W. Johnson, Warren, PA (US); Nathan J. Osborne, Baltimore, MD (US); Michael W. Roberts, York, PA (US); Steven J. Phillips, Ellicott City, MD (US); Michelle L. Bowers, Westminster, MD (US)

(73) Assignee: Black & Decker Inc., New Britain, CT (US)

( * ) Notice: Subject to any disclaimer, the term of this patent is extended or adjusted under 35 U.S.C. 154(b) by 423 days.

(21) Appl. No.: 15/442,869

(22) Filed: Feb. 27, 2017

(65) Prior Publication Data
US 2017/0170605 A1    Jun. 15, 2017

Related U.S. Application Data

(63) Continuation of application No. 13/721,191, filed on Dec. 20, 2012, now Pat. No. 9,614,387, which is a
(Continued)

(51) Int. Cl.
*H02J 7/00*    (2006.01)
*H01R 13/645*    (2006.01)
(Continued)

(52) U.S. Cl.
CPC ...... *H01R 13/6456* (2013.01); *H01M 10/425* (2013.01); *H01M 10/613* (2015.04);
(Continued)

(58) Field of Classification Search
CPC ...... H02J 7/0042; H02J 7/0044; H02J 7/0045; H02J 7/0052; H02J 7/0004; H02J 7/0006;
(Continued)

(56) References Cited

U.S. PATENT DOCUMENTS 5,213,913 A * 5/1993 Anthony, III ............. B25F 5/02
  292/244
5,391,972 A * 2/1995 Gardner .............. H01M 10/441
  320/115
(Continued)

FOREIGN PATENT DOCUMENTS

EP    1 780 818    5/2007
JP    2003-297306    10/2003
(Continued)

OTHER PUBLICATIONS

Partial EP Search Report dated Nov. 20, 2013 issued in corresponding EP application.
(Continued)

*Primary Examiner* — Richard Isla
*Assistant Examiner* — Mohammed J Sharief
(74) *Attorney, Agent, or Firm* — Michael Aronoff (57) ABSTRACT

It is common for a power tool system from a manufacturer to include a battery pack that is designed and configured to mate and operate with at least one power tool and a battery charger. However, as systems have evolved it has become desirable to provide a battery pack that is designed and configured to mate and operate with at least one power tool and a first battery charger but not a second battery charger. The present disclosure provides a battery pack including a housing, a terminal block, a plurality of terminals, and a mechanical lockout for allowing engagement with a power tool and a first battery charger while preventing engagement with a second battery charger.

10 Claims, 13 Drawing Sheets

Related U.S. Application Data continuation of application No. 12/213,159, filed on Jun. 16, 2008, now Pat. No. 7,799,448.

(60) Provisional application No. 60/945,003, filed on Jun. 19, 2007.

(51) Int. Cl.

| | | |
|---|---|---|
| *H01M 10/6554* | (2014.01) | |
| *H01M 10/6235* | (2014.01) | |
| *H01M 10/613* | (2014.01) | |
| *H01M 10/42* | (2006.01) | |
| *H05K 1/02* | (2006.01) | |
| *H01M 50/20* | (2021.01) | |
| *H01M 50/213* | (2021.01) | |
| *H01M 50/543* | (2021.01) | |
| *H01M 50/572* | (2021.01) | |

(52) U.S. Cl.
CPC ... *H01M 10/6235* (2015.04); *H01M 10/6554* (2015.04); *H01M 50/20* (2021.01); *H01M 50/213* (2021.01); *H01M 50/543* (2021.01); *H01M 50/572* (2021.01); *H02J 7/00* (2013.01); *H05K 1/026* (2013.01); *H01M 2010/4271* (2013.01); *H01M 2200/00* (2013.01); *H01M 2220/30* (2013.01)

(58) Field of Classification Search
CPC ............ H01R 13/6456; H01M 2/1055; H01M 10/6235; H01M 10/6554; H01M 10/613; H01M 2/30; H01M 2/1022; H01M 2/34; H01M 10/425; H01M 2220/30; H01M 2010/4271; H01M 2200/00; H01M 10/48; H01M 10/4257; H05K 1/026; Y02E 60/12
USPC .......................................... 320/106, 113, 115
See application file for complete search history.

(56) References Cited

U.S. PATENT DOCUMENTS

| | | | | |
|---|---|---|---|---|
| 6,075,341 | A * | 6/2000 | White | H02J 7/0045 320/114 |
| 6,493,198 | B1 | 12/2002 | Arledge et al. | |
| 2005/0017686 | A1 * | 1/2005 | Sakakibara | G01R 31/392 320/132 |
| 2005/0280393 | A1 * | 12/2005 | Feldmann | B25F 5/00 320/114 |
| 2006/0002047 | A1 | 1/2006 | Cheung et al. | |
| 2006/0002048 | A1 | 1/2006 | Cheung et al. | |
| 2006/0023386 | A1 | 2/2006 | Palinkas et al. | |
| 2006/0091858 | A1 * | 5/2006 | Johnson | H01M 50/213 320/128 |
| 2006/0268504 | A1 | 11/2006 | Shimizu et al. | |
| 2007/0103121 | A1 * | 5/2007 | Johnson | B25F 5/02 320/134 |
| 2007/0224492 | A1 * | 9/2007 | Scott | B25F 5/02 429/99 |
| 2008/0003494 | A1 * | 1/2008 | Rejman | H01M 2/1055 429/97 |
| 2013/0106343 | A1 * | 5/2013 | Cruise | H01M 10/613 320/106 |

FOREIGN PATENT DOCUMENTS

| | | |
|---|---|---|
| JP | 2006-172942 | 6/2006 |
| WO | 98/06144 | 2/1998 |
| WO | 2008/156602 | 12/2008 |

OTHER PUBLICATIONS

Non Final Office Action dated Apr. 22, 2015 issued in corresponding U.S. Appl. No. 13/721,191.
Final Office Action dated Nov. 3, 2015 issued in corresponding U.S. Appl. No. 13/721,191.
Non Final Office Action dated Feb. 26, 2016 issued in corresponding U.S. Appl. No. 13/721,191.
Final Office Action dated Aug. 11, 2016 issued in corresponding U.S. Appl. No. 13/721,191.
Notice of Allowance dated Dec. 1, 2016 issued in corresponding U.S. Appl. No. 13/721,191.
Non Final Office Action dated Oct. 7, 2009 issued in corresponding U.S. Appl. No. 12/213,159.
Notice of Allowance dated May 10, 2010 issued in corresponding U.S. Appl. No. 12/213,159.

* cited by examiner

BATTERY PACK FOR CORDLESS DEVICES

DOMESTIC PRIORITY INFORMATION

This application is a continuation of U.S. patent application Ser. No. 13/721,191 filed on Dec. 20, 2012 which is a continuation of U.S. patent application Ser. No. 12/213,159 filed on Jun. 16, 2008, now U.S. Pat. No. 7,799,448, issued Sep. 21, 2010 which claims priority under 35 U.S.C. § 119 to U.S. provisional application 60/945,003, filed Jun. 19, 2007; the entire contents of which are hereby incorporated by reference.

BACKGROUND

Field of the Invention

Example embodiments relate in general to a battery pack for cordless devices, and more particularly to a battery pack with mechanical and/or electrical protection features.

Description of Related Art

Battery packs may be used to power numerous and varied cordless devices, such as power tools, appliances and/or outdoor equipment, for example. Conventional battery packs may implement a circuit board (e.g., a printed circuit board) supporting electronic circuits. The electronic circuits may include components that are susceptible to mechanical and/or electrical failure.

SUMMARY

Example, non-limiting embodiments may implement features to mechanically and/or electrically protect various circuit components so that the electronics in the battery pack may be more robust.

The above and other features of example embodiments including various and novel details of construction and combinations of parts will now be more particularly described with reference to the accompanying drawings. It will be understood that the details of the example embodiments are shown by way of illustration only and not as limitations of the example embodiments. The principles and features of this invention may be employed in varied and numerous embodiments without departing from the spirit and scope of the invention.

BRIEF DESCRIPTION OF THE DRAWINGS

Example, non-limiting embodiments will be described with reference to the accompanying drawings, wherein like elements are represented by like reference numerals.

DESCRIPTION OF EXAMPLE, NON-LIMITING EMBODIMENTS

The following example, non-limiting embodiments are described with respect to a battery pack having a tower configuration. It will be appreciated, however, that various features of the example embodiments may be implemented on battery packs having alternative configurations (e.g., a rail configuration).

Figure 1:
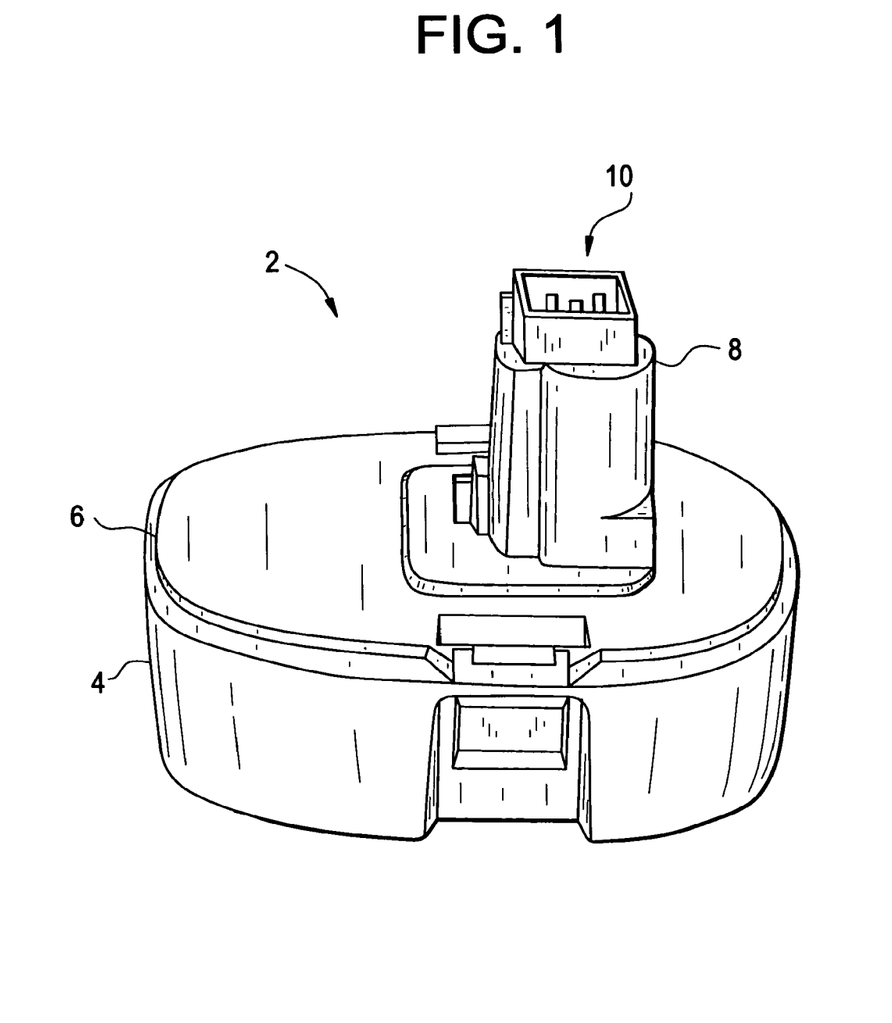
FIG. 1 is a perspective view of a battery pack according to an example, non-limiting embodiment.

With reference to FIG. 1, a battery pack 2 may include a lower housing 4 in which a plurality of cells (not shown) may be provided. The lower housing 4 may support an upper housing 6 with a tower portion 8 in which a printed circuit board ("PCB") may be provided. One or more cells may also be provided in the tower portion 8. The tower portion 8 may include an aperture through which a terminal block 10 (with a plurality of terminals) may be exposed.

Figure 2:
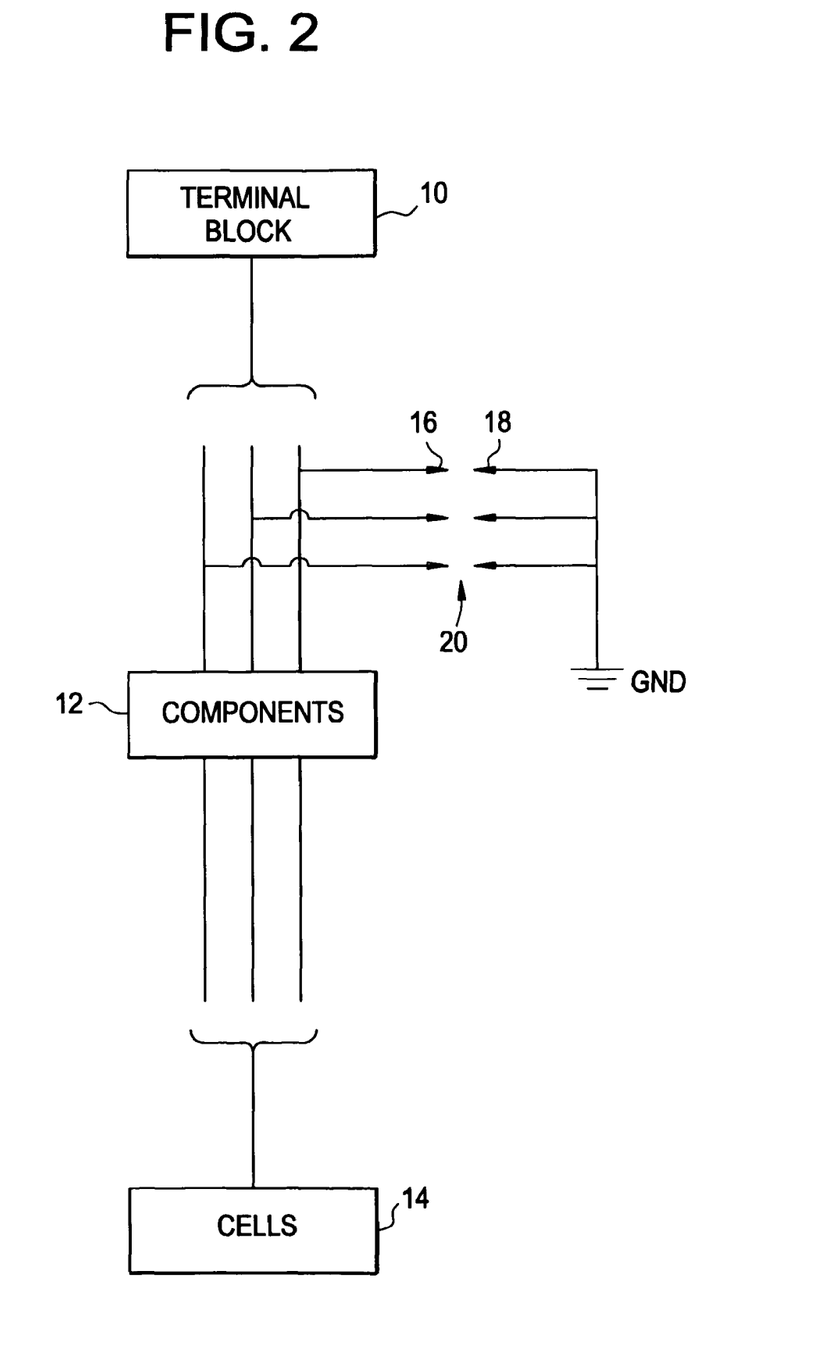
FIGS. 2-4 are schematic views of a spark gap and cover that may be implemented on a PCB according to an example, non-limiting embodiment.

I. PCB with ESD Protection Feature:

FIG. 2 schematically illustrates example electrical connections between the terminal block 10, the PCB and the cells of the battery pack 2. The terminal block 10 may be connected to components 12 supported by the PCB, and the components 12 may be connected to the cells 14.

The PCB may include traces extending between the terminal block 10 and the components 12. These traces may include portions leading to respective nodes 16. The PCB may also support nodes 18 that may respectively correspond to the nodes 16. Each pair of corresponding nodes 16, 18 may form a spark gap 20. The spark gaps 20 may be composed of a gas (e.g., air). The spark gaps 20 may serve to isolate the components 12 from an electrostatic discharge ("ESD") that may be on the order of kilovolts.

For example, the spark gaps 20 may operate at a 2 kV ESD from a user (but not limited to) touching a terminal of the terminal block 10. Here, a surge of relative high voltage may travel from the terminal block 10 to the node 16, at which point a spark will generate and arc across the spark gap 20 to the node 18. The high voltage may then be grounded by a grounding member provided on the PCB. The grounding member may be operatively connected to a cell. Alternatively, the high voltage may be dissipated to capacitors or surfaces acting as capacitors relative to ground (instead of being grounded).

During normal operation (involving relatively low voltages and low currents), signals may be transmitted between the terminal block 10 and the components 12, and without generating any spark across the spark gaps 20.

Figure 3:
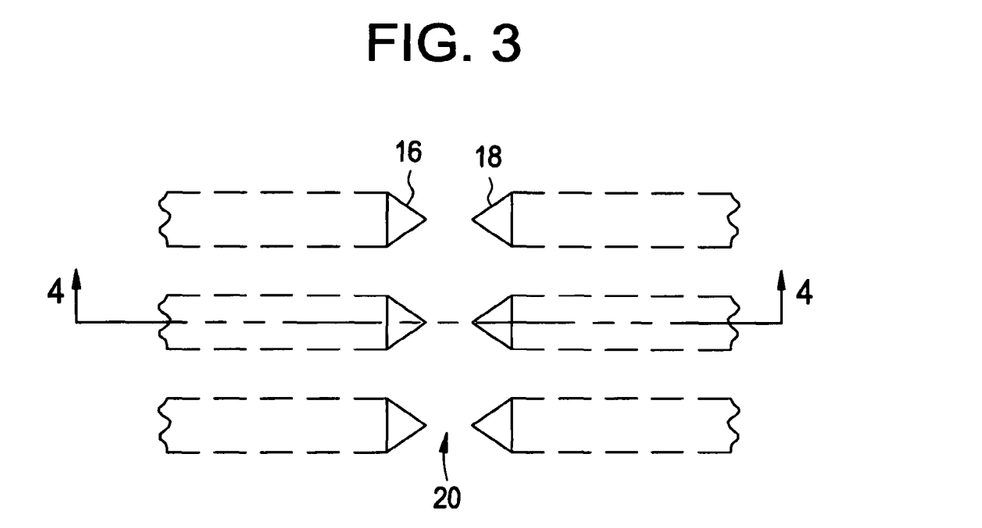

As shown in plan view in FIG. 3, the nodes 16, 18 defining the spark gaps 20 may have a triangular shape. In alternative embodiments, nodes having numerous and varied shapes may be suitably implemented. The nodes 16, 18 defining a particular spark gap 20 may have the same shape or different shapes.

Figure 4:
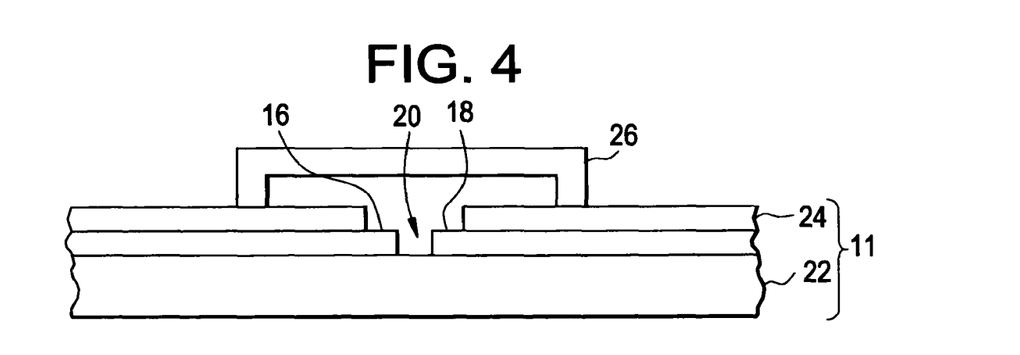

As shown in the sectional view of FIG. 4 (which is taken along the line 4-4 in FIG. 3), and by way of example only, the PCB 11 may be in the form of a laminate including a non-conductive substrate 22 supporting the traces that lead to the nodes 16, 18. A non-conductive layer 24 may be provided on the traces, leaving the nodes 16, 18 exposed. It will be readily appreciated that the PCB 11 may include one or more conductive layers, and that circuit components may be mounted on the opposed major surfaces of the PCB 10.

A cover 26 may be mounted on the non-conductive layer 24 to seal the spark gaps 20 in an atmosphere of air, or some other gas (for example). In alternative embodiments, the cover 26 may seal the spark gaps 20 in a liquid or solid. The cover 26 may be mounted on the PCB 11 via numerous and varied adhesives, which are well known in this art. The mounting of the cover 26 may occur before any conformal coating is applied to the PCB 11. The cover 26 may provide a common sealed atmosphere for multiple spark gaps 20. In alternative embodiments, a cover may provide a respective sealed atmosphere for each of the individual spark gaps 20. The cover 26 may be fabricated from numerous and varied material that are well known in this art.

As shown, the cover 26 may have a concavity that faces toward the spark gaps 20. In alternative embodiments, the cover may have a planar profile that extends across the spark gap 20 in planar fashion. As shown, the cover 26 may have a uniform cross sectional thickness. In alternative embodiments, the cover may have a varied cross sectional thickness.

The cover 26 may provide a controlled atmosphere in which the spark gap 20 may be operated. For example, debris from the environment may not enter into the spark gap 20. This may facilitate spark generation at a same voltage each time the system is hit with an ESD.

Figure 5:
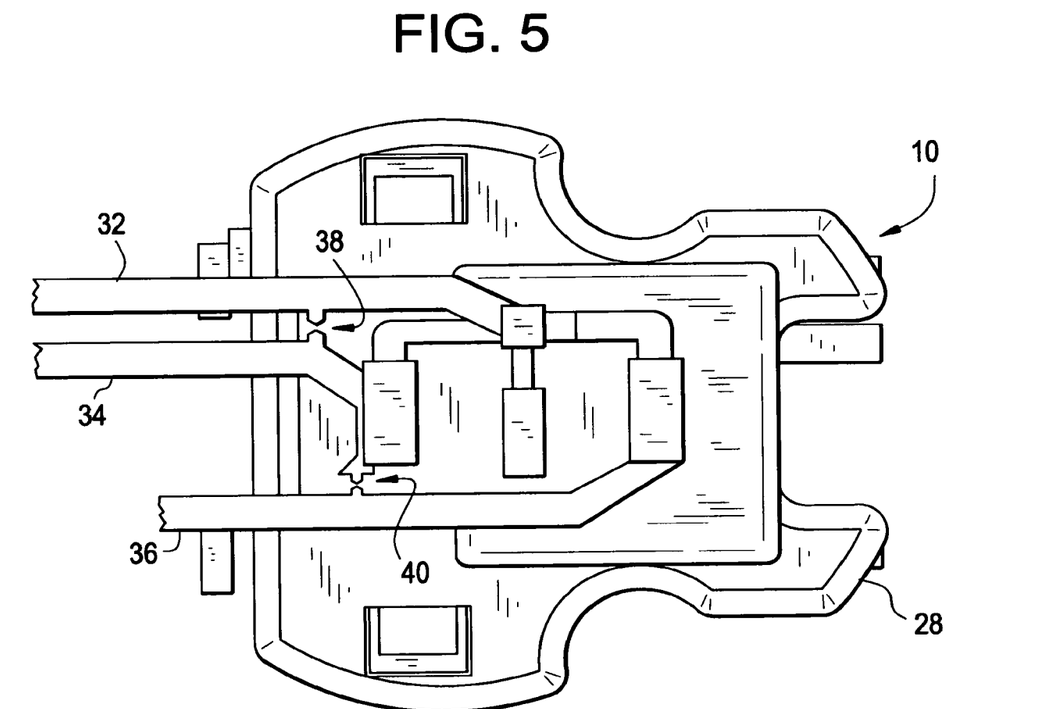
FIG. 5 is a schematic view of a spark gap that may implemented on a terminal block according to an example, non-limiting embodiment.

II. Terminal Block with ESD Protection Feature:

FIG. 5 illustrates a bottom view of an example terminal block 10. As shown, the terminal block 10 may include a base 28 fabricated from insulating material (e.g., plastic). The base 28 may support a plurality of metal terminals, inclusive of a signal terminal 32, a power negative (or ground) terminal 34 and a power positive terminal 36, for example. In alternative embodiments, the terminal block 10 may include more or less than three terminals.

One end of the metal terminals 32, 34, 36 (which extend into the drawing sheet and are therefore hidden from view in FIG. 5), may be exposed through the aperture in the tower 8 of the battery pack housing, as shown in FIG. 1, for example. Another end of the metal terminals 32, 34, 36 may be operatively connected to the PCB 11 and the cells of the battery pack, as shown in FIG. 2, for example. The terminal block 10 may be fabricated via conventional insert molding techniques, and other techniques that are well known in this art.

As shown, spark gap 38, 40 may be provided between the metal terminals 32, 34, 36. The spark gaps 38, 40 may be composed of a gas (e.g., air). The spark gaps 38, 40 may serve to isolate electrical components (e.g., the components 12 on the PCB 11) from an ESD that may be on the order of kilovolts. For example, the spark gap 38 may be provided between the signal terminal 32 and the power ground terminal 34. And the spark gap 40 may be provided between the power ground terminal 34 and the power positive terminal 36.

The spark gaps 38, 40 on the terminal block 10 may operate similar to the spark gaps 20 provided on the PCB 11, described above. Also, the nodes defining the spark gaps 38, 40 may have a triangular shape. In alternative embodiments, nodes having numerous and varied shapes may be suitably implemented. The nodes defining a particular spark gap may have the same shape or different shapes.

It will be readily apparent that the spark gaps 38, 40 may be implemented in combination with (or as an alternative to) the spark gaps 20 on the PCB. For example, the spark gaps 38, 40 on the terminal block 10 may effectively divert an ESD event before it even reaches the PCB 11. Moreover, providing spark gaps 38, 40 on the terminal block 10 may avoid placing spark gaps on the PCB 11 (which may consume valuable real estate on the surface of the PCB 11).

Figure 6:
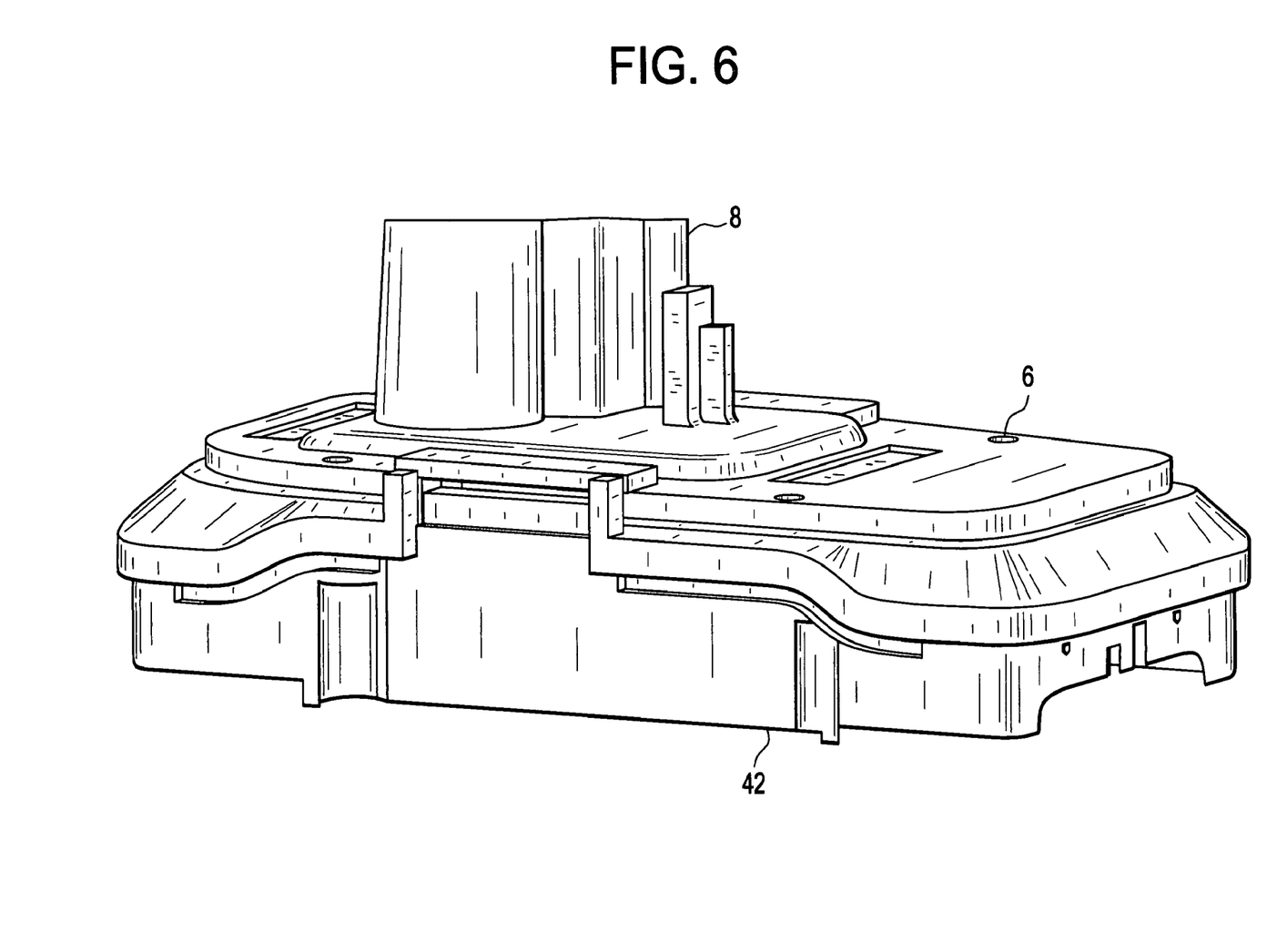
FIGS. 6 and 7 are perspective views of a skirt that may be implemented on a battery pack housing according to an example, non-limiting embodiment.
Figure 7:
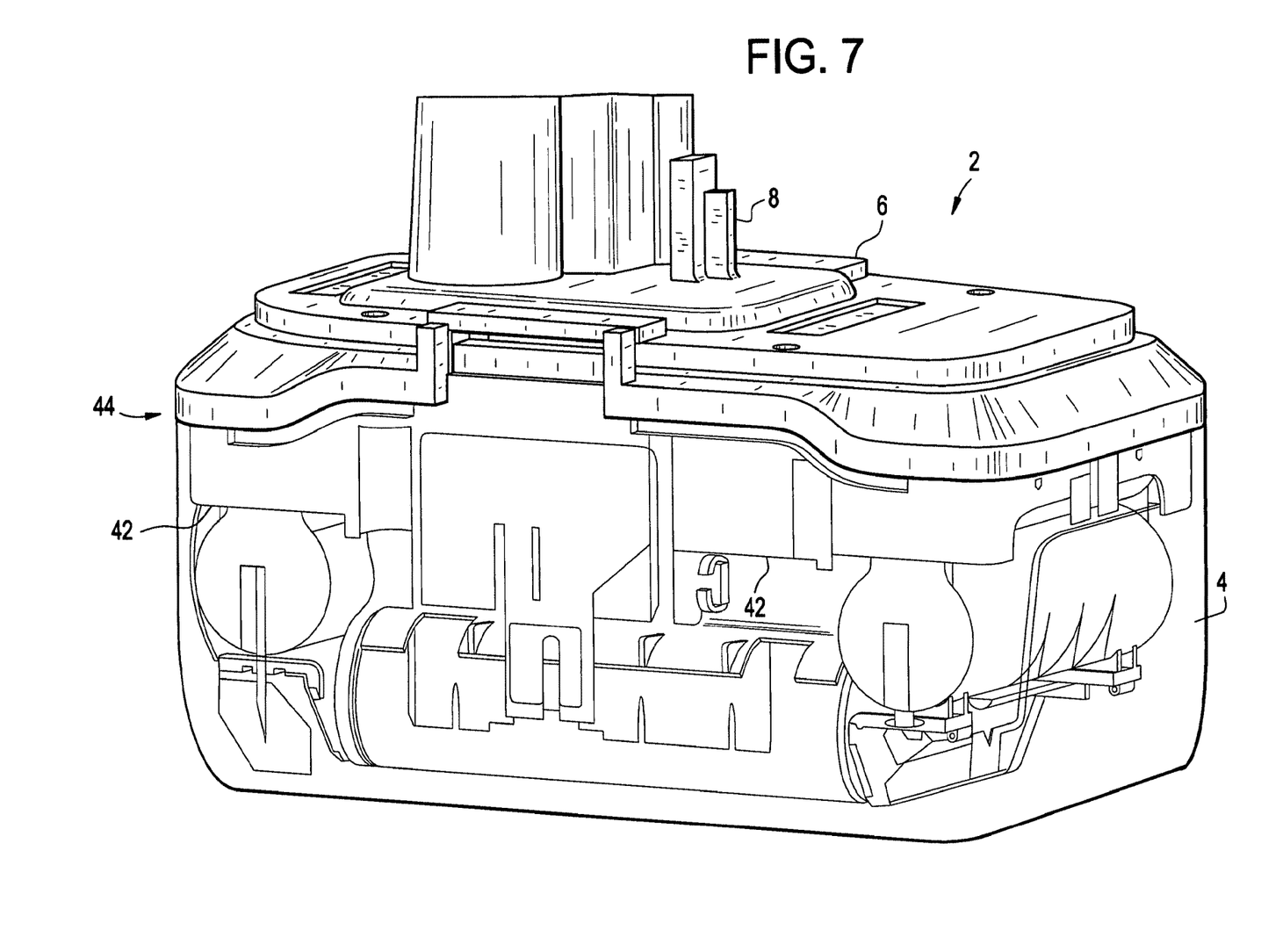

III. Housing with ESD Protection Feature:

FIGS. 6 and 7 illustrate an upper housing 6 that may be mounted on a lower housing 4 to enclose the component parts of the battery pack 2. The upper housing 6 may include a skirt 42. The skirt 42 may extend all the way around the perimeter of the upper housing 6. The skirt 42 may be fabricated from an electrically insulating material (e.g., plastic). By way of example only, the upper housing 6 and the skirt 42 may be of a unitary, one-piece construction.

As shown in FIG. 7, when the lower housing 4 and the upper housing 6 are assembled together, the skirt 42 may extend into the lower housing 4. The skirt 42 may be interposed between the lower housing 4 and the cells/conductive components within the battery pack 2. In this way, the skirt 42 may increase a creepage distance between an ESD source (e.g., a user) and the cells/conductive components within the battery pack 2. The creepage distance may be the distance from a parting line 44 between the lower and the upper housings 4, 6 (which could be an entry point for an ESD event) and the cells/conductive components within the battery pack 2.

The creepage distance may be determined based on basic immunity test methods, such as the standard "human body model" included in EN 61000-4-2 (but not limited to), which is incorporated herein in its entirety by reference. By way of example only, the skirt 42 may be sized to provide a creepage distance of at least 8 mm from the parting line 44 to the cells/conductive components within the battery pack 2. The skirt 42 may prevent personnel ESD events (and the associated transient currents and electromagnetic fields) from entering into the battery pack 2 via the parting line 44.

In alternative embodiments, the lower housing 4 may include a skirt that extends into the upper housing 6. The skirt may be interposed between the upper housing 6 and the cells/conductive components within the battery pack 2 to increase a creepage distance between an ESD source (e.g., a user) and the cells/conductive components within the battery pack 2.

In alternative embodiments, the battery pack housing may include numerous and varied cooperating housing parts (other than an upper housing and a lower housing). For example, a pair of side housings could be assembled together to form a vertical parting line, or a first housing part may be screw coupled to a second housing part. In such alternative embodiments, at least one of the housing parts may include a skirt that may increase a creepage distance between an ESD source (e.g., a user) and the cells/conductive components within the battery pack.

Figure 8:
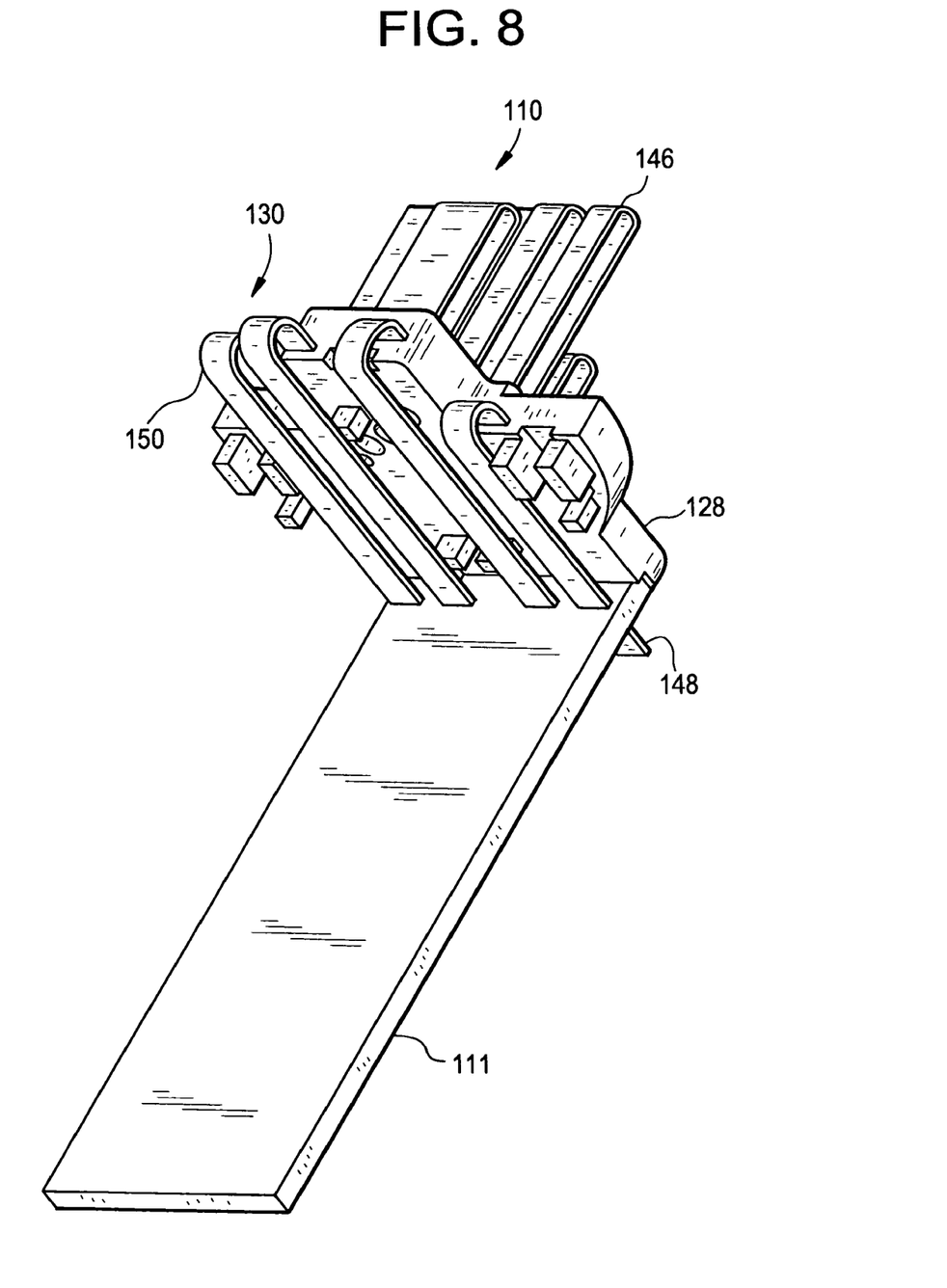
FIG. 8 is a perspective view of a terminal block implementing terminals with strain relief features according to an example, non-limiting embodiment.

IV. Terminal Block with Strain Relief Feature:

FIG. 8 illustrates another example embodiment of a terminal block 110. The terminal block 110 may include a base 128 fabricated from insulating material (e.g., plastic). The base 128 may support a plurality of metal terminals 130. The base 128 may support a PCB 111. The terminal block 110 may be fabricated via conventional insert molding techniques, and other techniques that are well known in this art.

The metal terminal 130 may include a connecting portion 146 that is exposed through the aperture in the tower of the battery pack housing. The connecting portion 146 may functionally serve to electrically connect the battery pack to a cordless device. In this example embodiment, the connecting portion 146 may have a blade shape. In alternative embodiments, the connecting portion may have numerous and varied shapes (e.g., a pin shape).

One or more of the metal terminals 130 may include an end portion 148 electrically connected to the PCB 111. By way of example only, the end portion 148 may be inserted into a slot provided in a pad (not shown) of the PCB 111. The end portion 148 may be soldered to the pad of the PCB 111.

One or more of the metal terminals 130 may also include a bent portion 150 provided between the base 128 and the PCB 111. As shown, for example, the bent portion 150 may extend from the body 128 in a first direction (away from the PCB 111), and then double back in a second direction (toward the PCB 111). In this example embodiment, the bent portion 150 may include only a single bend. In alternative embodiments, the bent portion may include more than a single bend.

The bent portion 150 may provide a strain relief feature. For example, a relative movement may occur between the base 128 and the PCB 111 due to impacts and/or vibrations that may occur during operation. During such movement, the bent portion 150 may reduce the chances of fatigue and/or failure of the solder joint between the metal terminal 130 and the PCB 111.

V. Assembly with Floating Electronics:

The control electronics of a battery pack may be positioned in the tower portion of a battery pack housing. To this end, the control electronics may be implemented in an assembly 249, as shown in FIG. 9.

Figure 9:
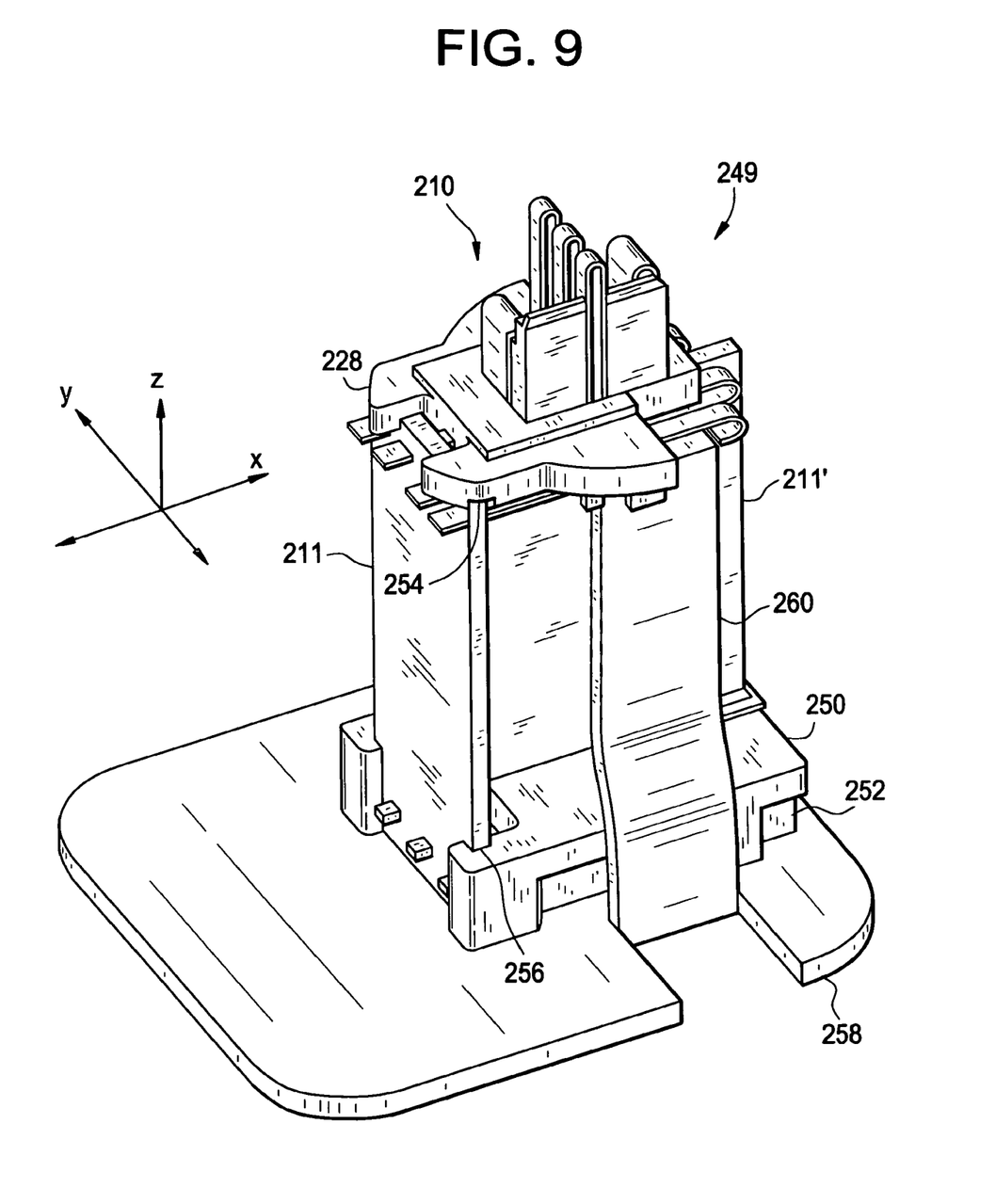
FIGS. 9 and 10 are perspective views of an assembly that may implement floating electronics according to an example, non-limiting embodiment.

With reference to FIG. 9, the assembly 249 may include two PCB's 211, 211' that support control circuitry and components. The PCB's 211, 211' may be arranged in a "T" shape, with one PCB oriented perpendicular to the other. Alternative embodiments may implement more or less than two PCB's, which may be arranged in numerous and varied layouts (other than a "T" shaped layout).

The PCB's 211, 211' may be sandwiched between a terminal block 210 (including a plurality of metal terminals) and a carrier 250, which may support a field effect transistor ("FET") module 252. To this end, the body 228 of the terminal block 210 and the carrier 250 may include grooves accommodating edge portions of the PCB's 211, 211'.

The grooves may cooperate to retain the PCB's 211, 211' in directions parallel to a plane defined by the x-y reference axes depicted in FIG. 9. For example, side walls of a groove 254 in the body 228 may retain the PCB 211 in the x direction, while the bottom of a groove 256 in the carrier 250 may retain the PCB 211 in the y direction. The grooves may, however, provide a clearance fit with the PCB's 211, 211' in the direction of the z reference axis depicted in FIG. 9. For example, the bottom of the groove 254 in the body 228 may be spaced apart from the upper edge portion of the PCB 211.

A heat sink 258 may be mounted on the FET module 252/carrier 250 and the body 228 of the terminal block 210. For example, the heat sink 258 may include a base portion connected to the FET module 252/carrier 250. The heat sink 258 may also include one or more legs 260 (extended in the z direction from the base) connected to the body 228 of the terminal block 210. In this example embodiment, the heat sink 258 may include a pair of opposed legs 260 (one of which is hidden from view in FIG. 9). By way of example only, the base of the heat sink 258 may be connected to the FET module 252 via a screw (not shown), and the legs 260 of the heat sink 258 may be connected to the body 228 of the terminal block 210 via a snap fit feature (or other method of retention).

The legs 260 of the heat sink 258 may be of sufficient size to maintain the clearance fit in the z direction between the PCB's 211, 211' and the base 228 of the terminal block 210 and/or the carrier 250. In this way, compressive loads applied to the assembly 249 in the z direction may be transmitted through the legs 260 of the heat sink 258 (which may be a more mechanically robust component), and not through the PCB's 211, 211' (which may be a less mechanically robust component). Such compressive loads may be applied to the assembly 249 when, for example, the assembly 249 is inserted into the tower portion of the battery back housing, the battery pack is coupled to a battery pack charger and/or the battery pack is coupled to a cordless device.

Figure 10:
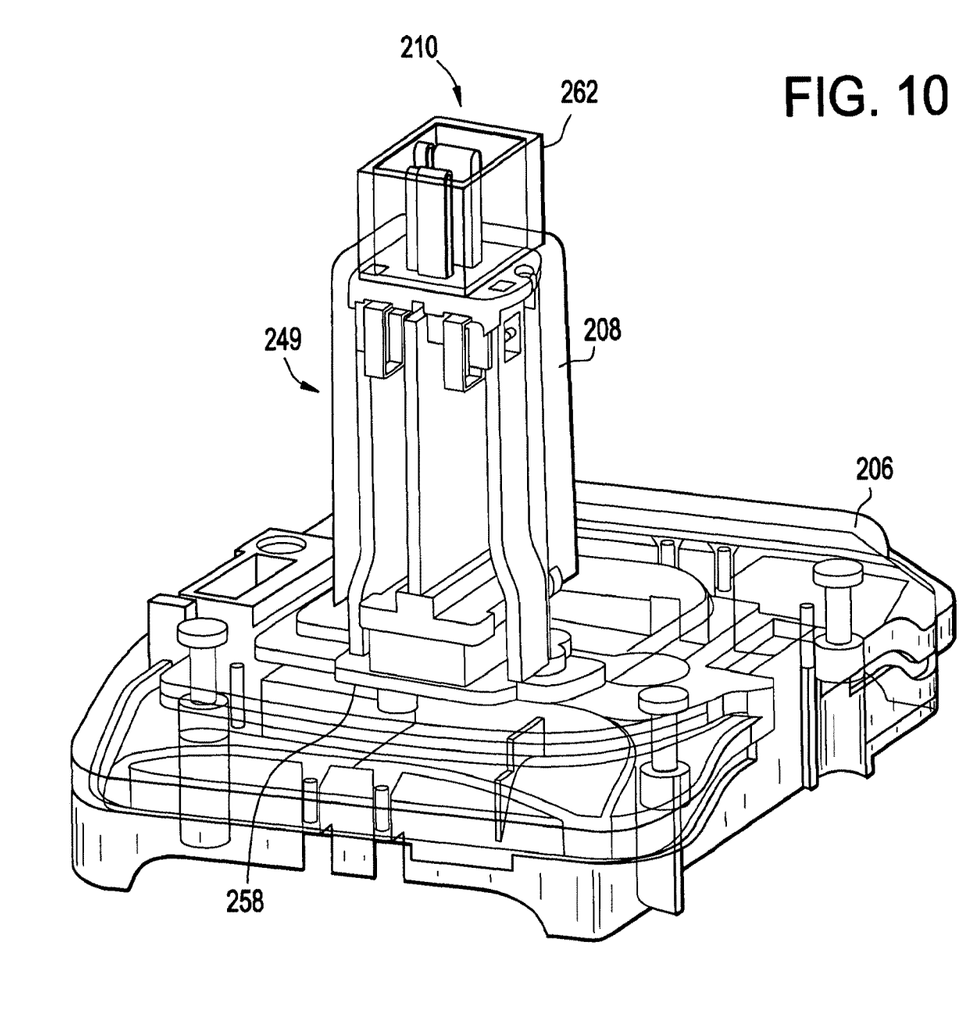

As shown in FIG. 10, the assembly 249 may be mounted in the tower portion 208 of the upper housing 206 of the battery pack. For example, the assembly 249 may be inserted into the tower portion 208 so that the terminal block 210 may be exposed through an aperture provided in the tower portion 208. A shroud 262 may extend around the opening in the tower portion 208. The assembly 249 may be retained in position by numerous and varied fasteners that are well known in this art. For example, screws may be inserted through apertures in the base of the heat sink 258 and screw coupled to boss portions (not shown) that may be provided on the interior of the tower portion 208.

Placing the assembly 249 in the tower portion 208 of the battery pack may reduce shocks and/or vibrations that may be experienced by the control electronics. Moreover, heat generated by the control electronics may be remotely located from the cells, which may be provided in the lower housing (not shown) connected to the upper housing.

VI. Terminal Block with Mechanical Lock Out Feature:

Battery packs may implement cells having numerous and varied cell chemistries, inclusive of (for example) Lithium-Ion (Li-Ion), Nickel-hydroxide/Cadmium (NiCad), and Nickel/Metal hydride (NiMH) chemistries. And battery pack chargers may be designed to recharge battery packs having specific cell chemistries. A battery pack charger may not charge and/or may improperly charge battery packs not meeting the specific criteria required for the individual charger. Accordingly, a battery pack having one cell chemistry may implement features incompatible with a battery pack charger designed to charge a battery pack having another, different cell chemistry.

Figure 11A:
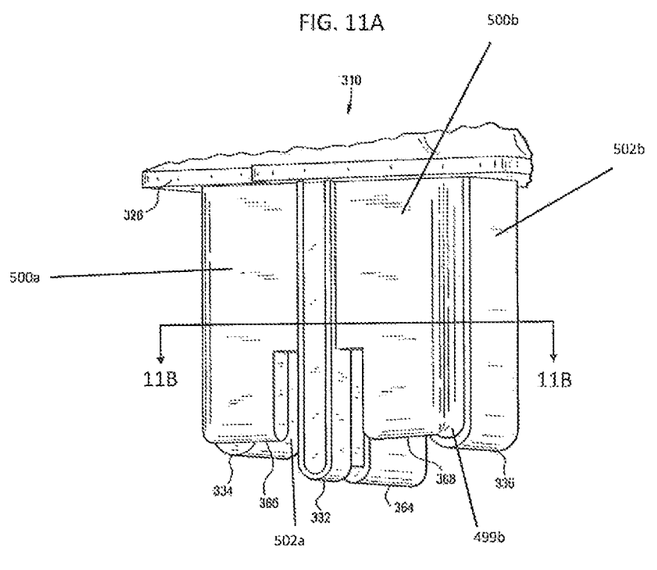
FIG. 11A is a perspective view of a terminal block that may implement a mechanical lock out feature according to an example, non-limiting embodiment
Figure 11B:
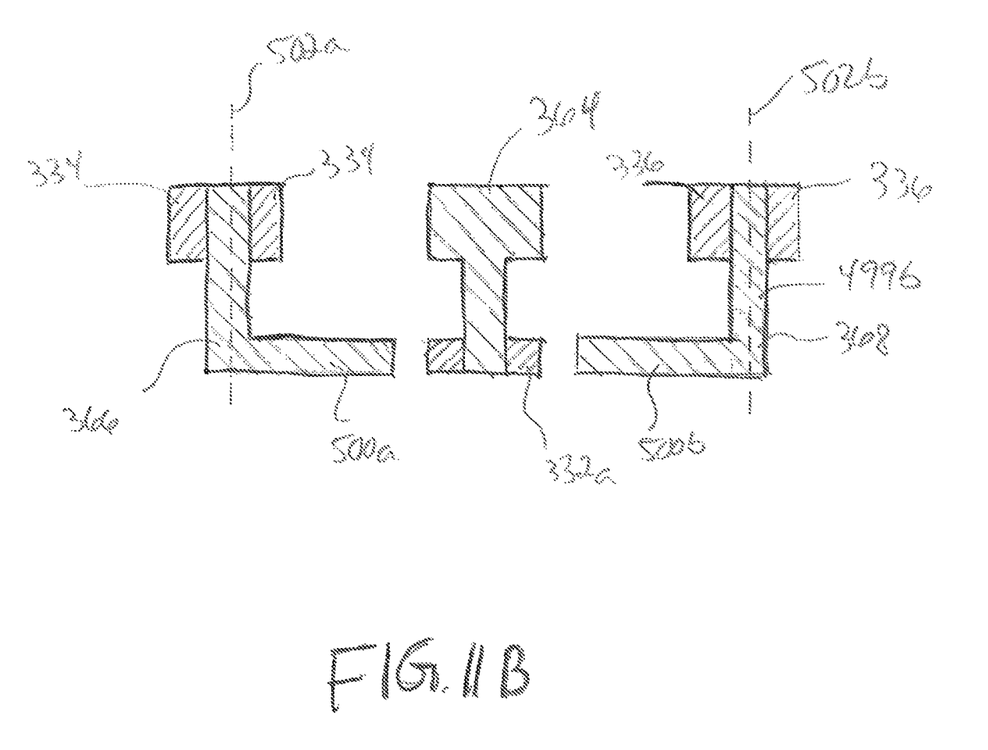
FIG. 11B is a section view taken along line 11B-11B of FIG. 11A.

Consider the example terminal block 310 depicted in FIG. 11. As shown, the terminal block 310 may include a base 328 fabricated from insulating material (e.g., plastic). The base 328 may support a plurality of metal terminals, inclusive of a signal terminal 332, a power negative (or ground) terminal 334 and a power positive terminal 336, for example. In alternative embodiments, the terminal block 310 may include more or less than three terminals.

The base 328 may include walls 364, 366, 368 supporting the metal terminals 332, 334, 336, respectively. For example, the wall 364 supporting the signal terminal 332 may have a planar shape. And each of the walls 366, 368 respectively may have a supporting portion 499a, 499b supporting the power negative terminal 334 and the power positive terminal 336 and may have a lock out portion 500a, 500b that extends from a plane 502a, 502b, respectively defined by the corresponding metal terminal 334, 336. As shown, for example, the lock out portions 500a, 500b of the walls 366, 368 may extend in a perpendicular fashion from the planes 502a, 502b respectively defined by the corresponding metal terminals 334, 336 toward the signal terminal 332. Thus, each of the walls 366, 368 may have an "L" shaped cross section.

The walls 366, 368 with lock out portions 500a, 500b may not interfere with the desired connections to numerous and varied, conventional cordless devices. Accordingly, the metal terminals 332, 334, 336 of the terminal block 310 may be engaged with a terminal set provided on a conventional cordless device.

However, the lock out portions 500a, 500b of the walls 366, 368 may prevent the metal terminals 332, 334, 336 from engaging with a terminal set of an inappropriate battery pack charger (e.g., one designed to charge a battery pack implementing a different cell chemistry). By way of example only, the terminal block 310 may be incorporated into a Li-Ion battery pack, while an inappropriate charger may be designed to charge a NiCad battery pack. The NiCad battery pack charger may include a housing in which a terminal set is provided. The terminal set may be accesses through opening in the housing. The openings may be rectangular in shape. Thus, the lock out portions 500a, 500b of the walls 366, 368 may mechanically prevent the metal terminals 332, 334, 336 of the terminal block 310 from entering into the openings in the charger and engaging with the terminal set.

In the illustrated embodiment, the lock out portions of the walls on the terminal block may extend in a perpendicular fashion from a plane defined by the corresponding metal terminal. In alternative embodiments, the lock out portions of the walls may extend in an inclined fashion from a plane defined by the corresponding metal terminal. Also, in alternative embodiments, more or less than two walls of the terminal block may include lock out portions. The walls with lock out portions on a given terminal block may have the same shape or different shapes.

Figure 12:
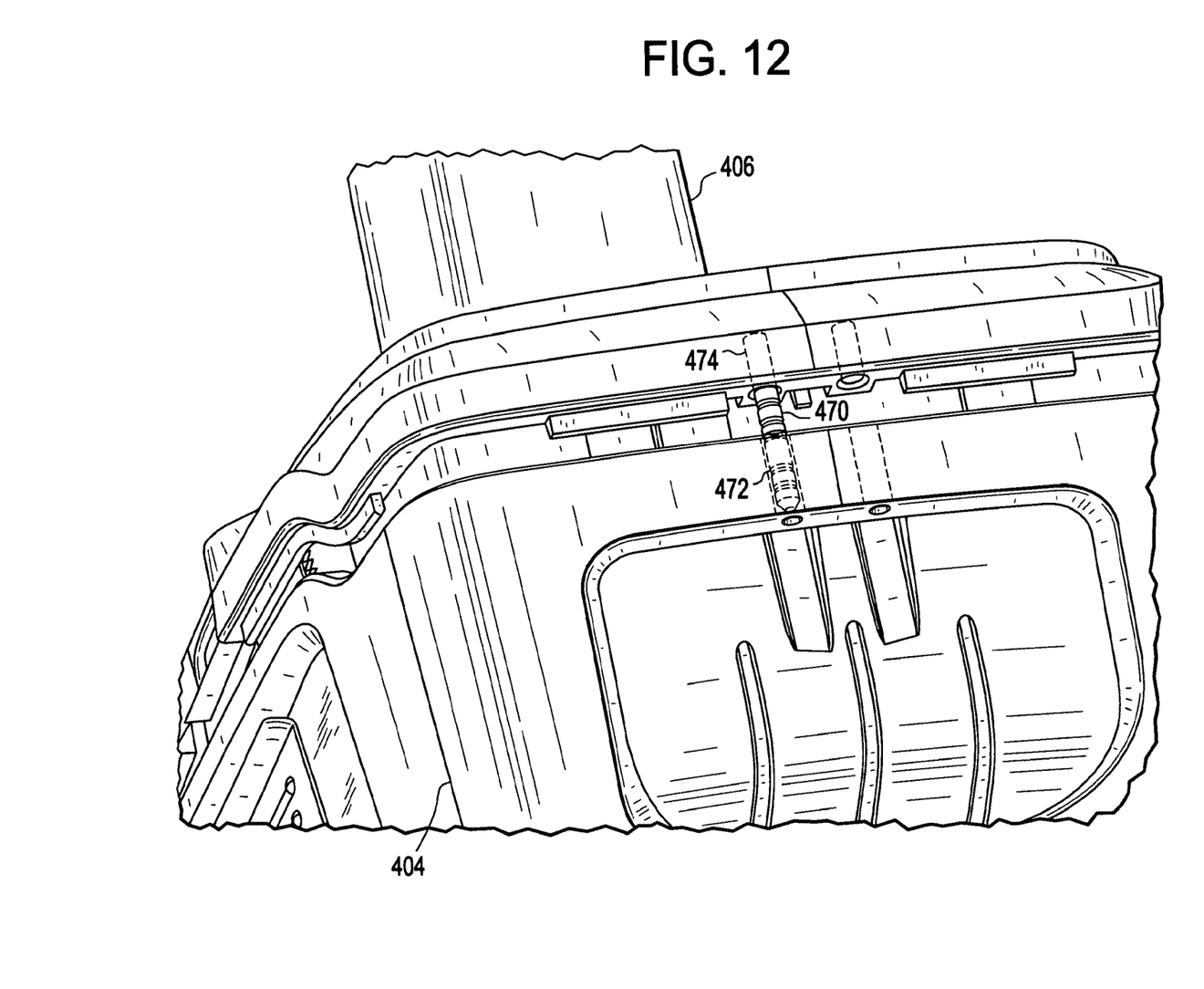
FIGS. 12 and 13 are perspective views of a fastener that may be implemented in a battery pack housing according to an example, non-limiting embodiment.

VII. Housing with Tamper Resistant Feature:

With reference to FIG. 12, a battery pack housing may include an upper housing 406 that may be mounted on a lower housing 404 to enclose the component parts of the battery pack. The upper housing 406 may be secured to the lower housing 404 by numerous and varied fasteners that are well known in this art. For example, screws (not shown) may be inserted through apertures in the upper housing 406 and screw coupled to boss portions (not shown) that may be provided on the interior of the lower housing 404. Additional fasteners may be implemented to discourage users from gaining access to the battery pack internals.

Figure 13:
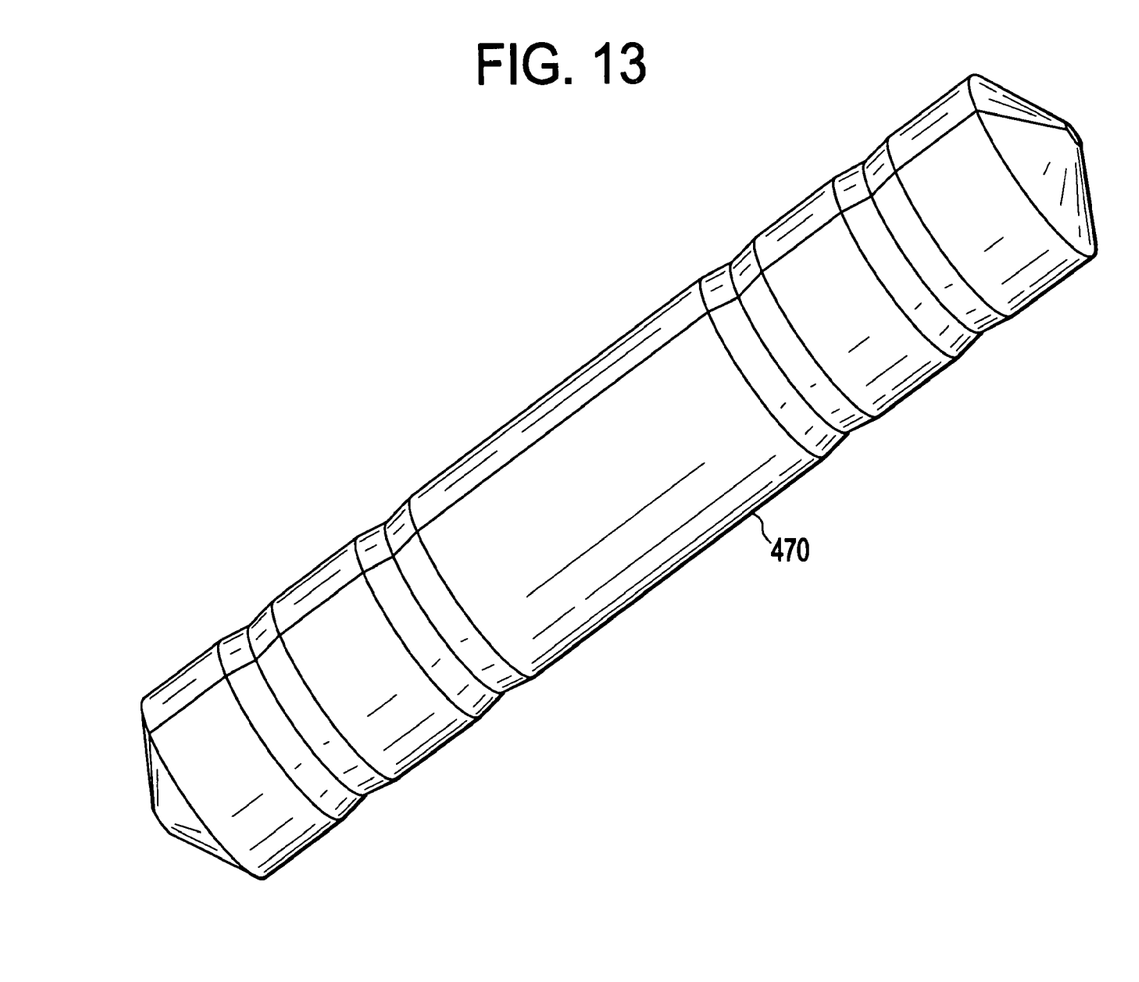

For example, as shown in FIGS. 12 and 13, the additional fasteners may be in the form of one or more pins 470. Each pin 470 may be inserted into a blind hole 472 provided in the lower housing 404 and a corresponding blind hole 474 provided in the upper housing 406. The pin 470 and the corresponding blind holes 472, 474 may be sized to provide an interference fit (or press fit) between the parts. As shown in FIG. 13, the pin 470 may include circumferential ribs and grooves (or some other surface features) to provide desired friction characteristics once inserted into the blind holes 472, 474.

For clarity, FIG. 12 illustrates the upper housing 406 spaced apart from the lower housing 404. In this condition, the pin 470, which may be only partially inserted into the corresponding blind holes 472, 474, may be viewed from the exterior of the battery pack. From the condition shown in FIG. 12, the upper housing 406 and the lower housing 404 may be pushed together causing the pin 470 to be fully inserted into the corresponding blind holes 472, 474 and hidden from view.

The pins 470 may reduce the chance of a user gaining access to the battery pack internals. For example, a user attempting to open the battery pack housing may remove any visible fasteners (such as screws) that may couple together the lower and the upper housings 404, 406. However, the user may not become aware of the pins 470 (which may be hidden from view). Thus, the pins 470 may remain press fitted to the lower and the upper housings 404, 406, keeping the component parts assembled together.

What is claimed is:

1. A battery pack, comprising:
    a housing;
    a terminal block with a plurality of battery terminals the plurality of battery terminals configured to mate with a corresponding plurality of tool terminals on a power tool, the plurality of tool terminals configured to mate with a corresponding plurality of battery terminals of another battery pack, and the battery terminals of the another battery pack configured to mate with a corresponding plurality of charger terminals on a battery charger, at least one of the plurality of battery terminals defining a first plane to a mating direction between the plurality of battery terminals and the plurality of tool terminals; and
    a mechanical lock out, the mechanical lock out including a wall having (1) a support portion (a) supporting at least one of the plurality of battery terminals and (b) extending parallel to the first plane and (2) a lock out portion (a) at one end of and (b) extending perpendicularly from the support portion for allowing engagement with the power tool while preventing engagement with the battery charger.

2. The battery pack, as recited in claim 1, wherein the lock out portion comprises a second wall extending from an end of the support portion.

3. The battery pack, as recited in claim 2, wherein the support portion and the second wall form an L-shape.

4. The battery pack, as recited in claim 1, wherein the mechanical lock out extends at an angle from the first plane.

5. The battery pack, as recited in claim 4, wherein the mechanical lock out extends substantially perpendicularly from the first plane.

6. A battery pack, comprising:
    a housing;
    a terminal block with a plurality of battery terminals, the plurality of battery terminals configured to mate with a corresponding plurality of tool terminals on a power tool, the plurality of tool terminals configured to mate with a corresponding plurality of battery terminals of another battery pack, and the battery terminals of the another battery pack configured to mate with a corresponding plurality of charger terminals on a battery charger, and
    a mechanical lock out, the mechanical lock out configured to allow the plurality of battery terminals to mate with the plurality of tool terminals while preventing the plurality of battery terminals from mating with the plurality of charger terminals,
    at least one of the plurality of battery terminals defines a plane parallel to a mating direction between the plurality of battery terminals and the plurality of tool terminals, and
    the mechanical lock out includes a wall supporting the at least one of the plurality of battery terminals, the wall supporting the at least one of the plurality of battery terminals in the defined plane and an identifying portion at one end of and extending from the supporting wall for allowing engagement with the power tool while preventing engagement with the battery charger.

7. The battery pack, as recited in claim 6, wherein the identifying portion comprises a second wall extending from an end of the supporting wall.

8. The battery pack, as recited in claim 7, wherein the supporting wall and the second wall form an L-shape.

9. The battery pack, as recited in claim 6, wherein the mechanical lock out extends at an angle from the defined plane.

10. The battery pack, as recited in claim 9, wherein the mechanical lock out extends substantially perpendicularly from the defined plane.

\* \* \* \* \*